United States Patent [19]
Crevasse et al.

[11] Patent Number: 6,080,671
[45] Date of Patent: Jun. 27, 2000

[54] PROCESS OF CHEMICAL-MECHANICAL POLISHING AND MANUFACTURING AN INTEGRATED CIRCUIT

[75] Inventors: Annette Margaret Crevasse, Orlando; Brian David Crevasse, Apopaa; William Graham Easter; John Albert Maze, III, both of Orlando, all of Fla.

[73] Assignee: Lucent Technologies Inc., Murray Hill, N.J.

[21] Appl. No.: 09/136,095

[22] Filed: Aug. 18, 1998

[51] Int. Cl.$^7$ ................................................. H01L 21/302
[52] U.S. Cl. ........................... 438/691; 438/692; 438/693
[58] Field of Search .................................. 438/691, 692, 438/693

[56] References Cited

U.S. PATENT DOCUMENTS

| | | | |
|---|---|---|---|
| 4,770,927 | 9/1988 | Effenberger et al. | 428/245 |
| 5,039,754 | 8/1991 | Sanchez | 525/333.8 |
| 5,198,280 | 3/1993 | Harpell et al. | 428/102 |
| 5,230,937 | 7/1993 | Effenberger et al. | 428/113 |
| 5,264,290 | 11/1993 | Touchet et al. | 428/492 |
| 5,287,663 | 2/1994 | Pierce et al. | 51/401 |
| 5,624,303 | 4/1997 | Robinson | 451/285 |
| 5,733,176 | 3/1998 | Robinson et al. | 451/41 |
| 5,823,855 | 10/1998 | Robinson | 451/41 |
| 5,921,855 | 7/1999 | Osterheld et al. | 451/527 |

*Primary Examiner*—Benjamin L. Utech
*Assistant Examiner*—Matt Anderson
*Attorney, Agent, or Firm*—Anthony Grillo

[57] ABSTRACT

A polishing process to planarize a layer formed on a substrate and to reduce the variations in the thickness of that layer from substrate to substrate. The polishing process is implemented by polishing a substrate using a stable pad material. A stable pad material is formed from a polishing material that has substantially the same or similar density, hardness, and compressibility as polyurethane but is a material other than or substantially other than polyurethane. In an alternative embodiment, the material for the polishing pad may be selected for its compression, high tensile strength, wear resistance and/or resistance to water, diluted acids, and alkalis. In a further alternative embodiment, the material forming the polishing pad may be selected from the group comprising hydrogenated nitrile compounds, fluoroelastomers, or perfluoroelastomers.

9 Claims, 2 Drawing Sheets

PROCESS OF CHEMICAL-MECHANICAL POLISHING AND MANUFACTURING AN INTEGRATED CIRCUIT

FIELD OF THE INVENTION

The present invention relates generally to integrated circuit manufacturing and, more particularly, to chemical mechanical polishing for manufacturing an integrated circuit.

BACKGROUND OF THE INVENTION

Today's semiconductor technology is rapidly forcing device sizes below the 0.5 micron level, even to the 0.25 micron size. With device sizes on this order, ever higher precision is being demanded of the processes that form and shape the devices and the dielectric layers separating the active devices. In the fabrication of semiconductor components, the various devices are formed in layers upon an underlying substrate typically composed of silicon, germanium, or gallium arsenide. Metal conductor lines form interconnects between the various discrete devices. The metal conductor lines are further insulated from the next interconnection level by thin films of insulating material deposited by, for example, CVD (Chemical Vapor Deposition) of oxide or application of SOG (Spin On Glass) layers followed by fellow processes. Holes, or vias, formed through the insulating layers provide electrical connectivity between successive conductive interconnection layers. In such microcircuit wiring processes, it is highly desirable that the insulating layers have a smooth surface topography, since it is difficult to lithographically image and pattern layers applied to rough surfaces.

One semiconductor manufacturing process, chemical mechanical polishing (CMP), is used to provide the necessary smooth semiconductor topographies. CMP can be used for planarizing: (a) insulator surfaces, such as silicon oxide or silicon nitride, deposited by chemical vapor deposition; (b) insulating layers, such as glasses deposited by spin-on and reflow deposition means, over semiconductor devices; or (c) metallic conductor interconnection wiring layers. Semiconductor wafers may also be planarized to: control layer thickness, sharpen the edge of via "plugs," remove a hardmask, remove other material layers, etc. Significantly, a given semiconductor wafer may be planarized several times, such as upon completion of each metal layer. For example, following via formation in a dielectric material layer, a metallization layer is blanket deposited and then CMP is used to produce planar metal studs.

Briefly, the CMP process involves holding and rotating a thin, reasonably flat, semiconductor wafer against a rotating polishing surface. A chemical slurry, under controlled chemical, pressure, and temperature conditions wets the polishing surface. The chemical slurry contains a polishing agent, such as alumina or silica, which is used as the abrasive material. Additionally, the slurry contains selected chemicals to etch or oxidize selected surfaces of the wafer to prepare them for removal by the abrasive. The combination of both a chemical reaction and mechanical removal of the material during polishing results in superior planarization of the polished surface. In this process it is important to remove a sufficient amount of material to provide a smooth surface, without removing an excessive amount of underlying materials. Accurate material removal is particularly important in today's submicron technologies where the layers between device and metal levels are constantly getting thinner.

One problem area associated with chemical mechanical polishing is in the area of polishing pads. Typically, the polishing pad or surface is a polyurethane pad. Applicants have determined that variations between polyurethane pads cause variations during the CMP process. For example, two different polyurethane pads used to polishing similar oxide layers on different substrates may result in an oxide thickness variation of 20% to 30%.

The chemical reaction of urea and aminos to form polyurethane is extremely sensitive to contaminants such as water. The contaminants cause variations in the polyurethane pads that bring about variations in the performance of the polyurethane pads. Manufactures of the polyurethane pads have sought to improve the polyurethane pads to eliminate these variations.

SUMMARY OF THE INVENTION

The present invention is directed to a polishing process to planarize a layer formed on a substrate and reduce the variations in the thickness of That layer from substrate to substrate using different polishing pads. The polishing process is implemented by polishing a substrate using a stable pad material. A stable pad material is formed from a polishing material that has substantially the same or similar density, hardness, and compressibility as polyurethane but is a material other than or substantially other than polyurethane.

In an alternative embodiment, the material for the polishing pad may be selected for its compression, high tensile strength, wear resistance and/or resistance to water, diluted acids, and alkalis.

In a further alternative embodiment, the material forming the polishing pad may be selected from the group comprising hydrogenated compounds, fluoroelastomers, or perfluoroelastomers.

It is to be understood that both the foregoing general description and the following detailed description are illustrative, but are not restrictive, of the invention.

BRIEF DESCRIPTION OF THE DRAWING

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

To address the deficiencies of the prior art, the present invention provides a unique polishing system that may be used during integrated circuit manufacture. The illustrative embodiment is implemented by polishing a substrate using a stable pad material. A stable pad material is formed from a material that has substantially the same or similar density, hardness, and/or compressibility as polyurethane but is a material other than polyurethane or a material substantially other than polyurethane. In an alternative embodiment, the material for the polishing pad may be selected for its compression characteristics, high tensile strength, wear resistance, and/or resistance to water, diluted acids, and alkalis. In a further alternative embodiment, the material of the polishing pad may be selected from the group including hydrogenated compounds, fluoroelastomers, or perfluoroelastomers. The illustrative embodiments provide a polishing pad that reduces variations between polishing pads and, as a result, variations in materials polished with the polishing pads.

Figure 1A:
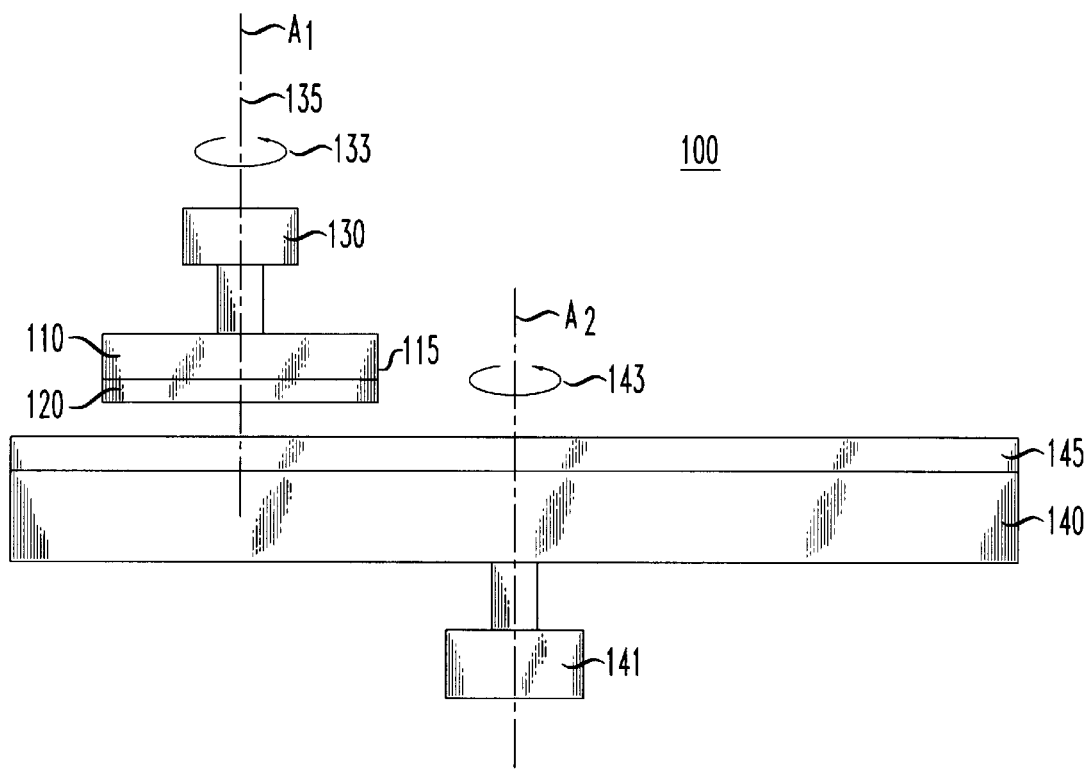
FIG. 1A is a schematic diagram of a chemical mechanical polishing system.

Referring now to the drawing, wherein like reference numerals refer to like elements throughout, FIG. 1A is a schematic diagram of an illustrative CMP system. The CMP system 100 may be of a conventional design that includes a wafer carrier or polishing head 110 for holding a semiconductor wafer 120. The wafer carrier 110 typically comprises a retaining ring 115, which is designed to retain the semiconductor wafer 120. The wafer carrier 110 is mounted to a drive motor 130 for continuous rotation about axis $A_1$ in a direction indicated by arrow 133. The wafer carrier 110 is adapted so that a force indicated by arrow 135 is exerted on the semiconductor wafer 120. The CMP system 100 further comprises a polishing platen 140 mounted to a second drive motor 141 for continuous rotation about axis $A_2$ in a direction indicated by arrow 143. A polishing pad 145 is mounted to the polishing platen 140, which provides a polishing surface for the process.

The polishing pad 145 is formed from a stable pad material. A stable pad material is formed from a polishing material that has substantially the same or similar density, hardness, and/or compressibility as polyurethane but is a material other than polyurethane or a material substantially other than polyurethane. In an alternative embodiment, the material for the polishing pad may be selected for its compression characteristics, high tensile strength, wear resistance, and/or resistance to water, diluted acids, and alkalis. For example, materials having a compression from 0.5% to 4.0% and a specific gravity of 0.50 to 0.90 gram/cubic centimeter may be used.

In an alternative embodiment, the materials for the polishing pad may be selected from hydrogenated nitrile compounds. The hardness of the hydrogenated nitrile compounds is approximately 55A–60D using a shore durometer.

In another illustrative embodiment, the materials for the polishing pad may be selected from fluoroelastomers. Fluoroelastomers provide good wear resistance, high tensile strength, very good compression characteristics, and excellent resistance to water, diluted acids, and alkalis. One fluoroelastomer that may be used is Viton® available from E.I. DuPont Corporation located in Wilmington, Del. Viton® is a polymer formed using a combination of vinylidene fluoride ($VF_2$), hexafluoropropylene, and tetrafluoroethylene.

In a further illustrative embodiment, the materials for the polishing pad may be selected from perfluoroelastomers. Perfluoroelastomers provide exceptional chemical resistance to water, alkalis, and diluted acids. One perfluoroelastomer that may be used is Kalrez® available from E.I. DuPont Corporation located in Wilmington, Del.

Each of the illustrative polishing pads may be formed in sheets and then stamped out into the appropriate shape for the particular polishing system. A series of polishing pads may be stamped from the same sheet and used in the polishing system. This further ensures consistency between polishing pads.

During CMP, a polishing slurry 150, which comprises an abrasive material in a colloidal suspension of either a basic or an acidic solution, is dispensed onto the polishing pad 145. In a particularly advantageous embodiment, the abrasive material may be amorphous silica or alumina and has a design, i.e., specification, particle size chosen for the material being polished.

Figure 1B:
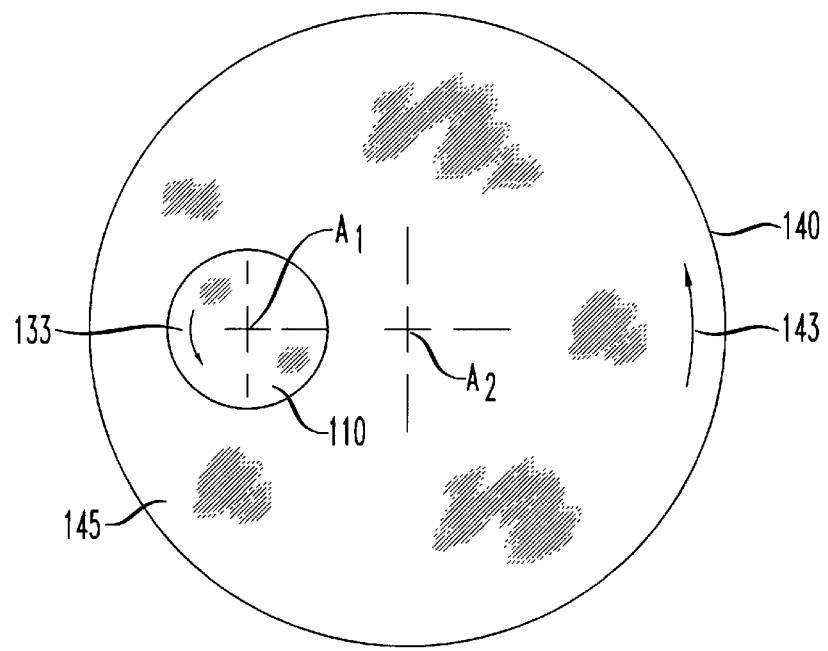
FIG. 1B is a schematic plan overhead view of the chemical mechanical polishing system shown in FIG. 1A.

Referring now to FIG. 1B, illustrated is a schematic plan overhead view of the CMP apparatus of FIG. 1A with the key elements shown. The wafer carrier 110 is shown to rotate in a direction indicated by arrow 133 about the axis $A_1$. The polishing platen 140 is shown to rotate in a direction indicated by arrow 143 about the axis $A_2$. Polishing slurry is dispensed onto the polishing pad 145.

Figure 2:
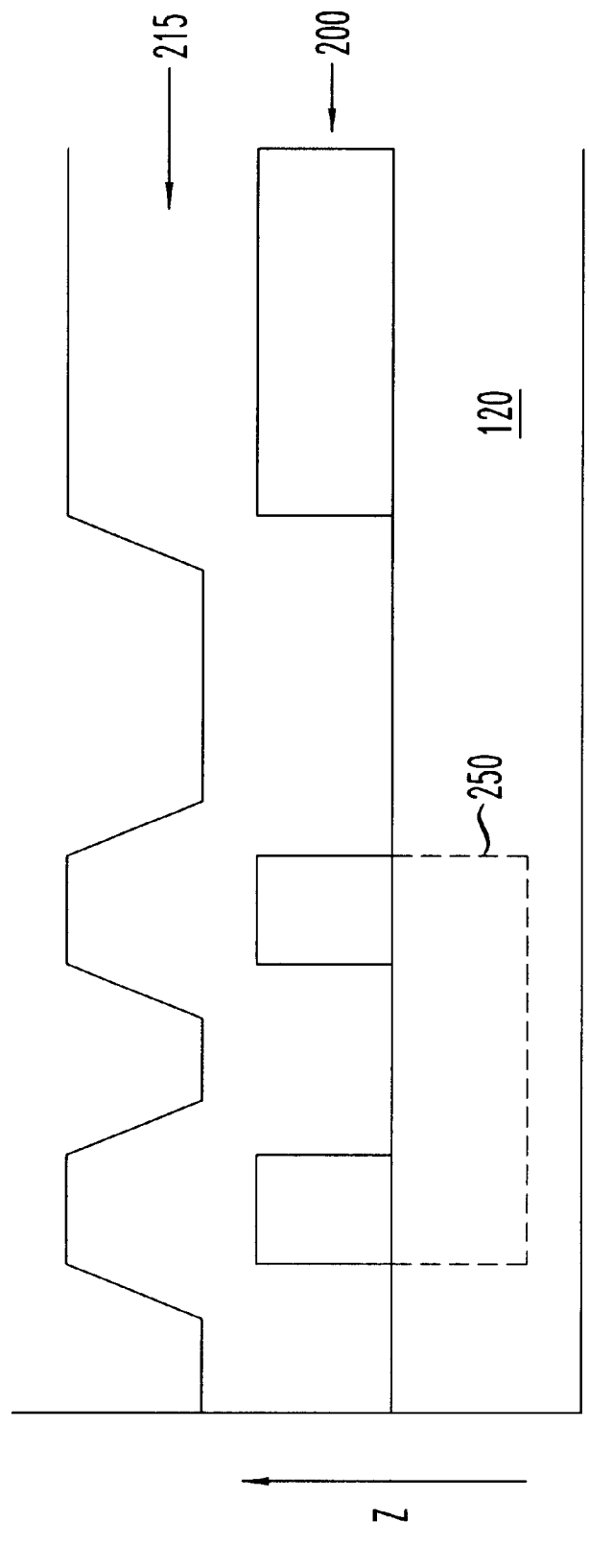
FIG. 2 is a schematic diagram of an inter-level dielectric layer formed in an integrated circuit.

The operation of the polishing system 100 is described below with reference to FIG. 2, which is a schematic diagram of an integrated circuit during a step in the manufacturing process. The integrated circuit includes a patterned layer 200 formed on a substrate 120. The substrate 120 may include, for example, silicon, germanium, gallium arsenide or other materials known to those skilled in the art. The patterned layer 200 may be, for example, a metal layer that includes tungsten, aluminum, titanium, or other metal or materials used in semiconductor devices as is known in the art.

The substrate 200 may also include devices 250 such as CMOS devices, bipolar junction transistors, or other devices formed in integrated circuits as is known in the art. In an alternative embodiment, additional layers may be formed between the substrate 120 and the patterned layer 200. A planarization layer 215 is formed on the patterned layer 200. The planarization layer 215 may be, for example, an oxide. The thickness Z of the planarization layer 115 varies in response to the variations in the in the patterned layer 200. These variations are reduced using chemical mechanical polishing (CMP).

The substrate 10 is placed in the wafer carrier 110, shown in FIG. 1A, of the CMP system 100. The CMP system 100 is, for example, an Auriga Planarization System, Auriga-C Planarization System, or a CMP 5, each available from Speedfam of 7406 West Detroit, Chandler, Ariz. 85228. Applying a slurry and rotating the substrate 120 disposed in the wafer carrier 110 polishes the substrate 120. The illustrative process may be used during integrated circuit manufacture to planarize the planarization layer 215. Using the illustrative polishing pads reduces variations in polished materials (such as planarization layer 215) using different polishing pads made of the same material. In other words, changing the polishing pad does not cause significant changes in the polishing process or significant variations in the thickness of the polished layers.

Although the invention has been described with reference to illustrative embodiments, it is not limited to those embodiments. Rather, the appended claims should be construed to include other variants and embodiments of the invention that may be made by those skilled in the art without departing from the true spirit and scope of the present invention.

What is claimed:

1. A process of manufacturing an integrated circuit comprising the steps of:
   (a) providing a substrate;
   (b) providing a polishing pad formed from a polishing pad material including one of hydrogenated nitrile compounds, fluoroelastomers, or perfluoroelastomers; and
   (c) polishing the substrate using the polishing pad.

2. The process of claim 1 wherein the stable polishing pad material is formed from a material that has a specific gravity of 0.50 to 0.90 gram/cubic centimeter.

3. The process of claim 2 wherein the stable polishing pad material is formed from a material that has a compressibility from 0.5% to 4.0%.

4. The process of claim 1 wherein the stable polishing pad material is formed from a material that has a compressibility from 0.5% to 4.0%.

5. The process of claim 1 wherein the stable polishing pad material comprises a material other polyurethane.

6. A process of manufacturing an integrated circuit comprising the steps of:

(a) providing a substrate;

(b) providing a polishing pad formed from a material selected from the group consisting of hydrogenated nitrile compounds, fluoroelastomers, or perfluoroelastomers; and (c) polishing the substrate using the polishing pad.

7. The process of claim 6 wherein the material is selected from the group of hydrogenated nitrile compounds.

8. The process of claim 6 wherein the material is selected from the group of fluoroelastomers.

9. The process of claim 6 wherein the material is selected from the group of perfluoroelastomers.

* * * * *